US006630840B2

(12) United States Patent
Tomita

(10) Patent No.: US 6,630,840 B2
(45) Date of Patent: Oct. 7, 2003

(54) ARRAY SUBSTRATE INSPECTION METHOD WITH VARYING NON-SELECTION SIGNAL

(75) Inventor: Satoru Tomita, Saitama-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 72 days.

(21) Appl. No.: 09/861,523

(22) Filed: May 22, 2001

(65) Prior Publication Data

US 2001/0052788 A1 Dec. 20, 2001

(30) Foreign Application Priority Data

May 24, 2000 (JP) ....................................... 2000-153057

(51) Int. Cl.[7] ................................................ G01R 31/28
(52) U.S. Cl. ........................................ 324/765; 324/770
(58) Field of Search ................................. 324/770, 765, 324/158.1, 73.1; 349/187; 438/14, 17, 18

(56) References Cited

U.S. PATENT DOCUMENTS 5,113,134 A * 5/1992 Plus et al. ................. 324/73.1
5,377,030 A * 12/1994 Suzuki et al. ............... 324/770
5,465,053 A * 11/1995 Edwards ..................... 324/770
5,506,516 A * 4/1996 Yamashita et al. .......... 324/770
5,994,916 A * 11/1999 Hayashi ...................... 324/770
6,265,889 B1 * 7/2001 Tomita et al. ............. 324/770

* cited by examiner

*Primary Examiner*—Vinh P. Nguyen
(74) *Attorney, Agent, or Firm*—Oblon, Spivak, McClelland, Maier & Neustadt, P.C.

(57) ABSTRACT

Each of analogue switches (ASW1 to ASWn) enters a non-conductive state (namely, Off state) by using two kinds of off-voltages Vbs which are different voltages. In this state, a test signal stored in a supplemental capacity (13) is kept during a desired time period and then red it. The waveforms of the two test signals corresponding to the two kinds of the off-voltages Vbs are compared to each other. By using the comparison result, it is possible to detect a presence of off-leak defect in an array substrate fabrication process and to easily distinguish the off-leak defect from other types of defects.

10 Claims, 2 Drawing Sheets

ARRAY SUBSTRATE INSPECTION METHOD WITH VARYING NON-SELECTION SIGNAL

CROSS-REFERENCE TO RELATED APPLICATION

This application claims benefit of priority under 35 USC § 119 to Japanese Patent Application No.P2000-153057, filed on May 24, 2000, the entire contents of which are incorporated herein by reference.

BACKGROUND OF THE INVENTION

1. Field of the Invention

The present invention relates to an inspection method of detecting defects on an array substrate that is mainly used in a liquid crystal display (LCD) device of active-matrix type, and, more particularly, to an inspection method of detecting defects in analogue switches, each made up of TFT, formed on an array substrate.

2. Description of the Related Art

Recently, liquid crystal display (LCD) devices of active-matrix (AM) type have become widely available as the display devices for notebook type personal computers and mobile type information terminals. In the LCD device of AM type, a switch element is placed for each picture element. In particularly, use of the display devices made up of poly-silicon thin film transistors (TFT) can contribute to performing easy wiring and also reduce the size of devices because driver circuits in addition to an element section can also be integrated on an array substrate.

The driver circuits integrated on the array substrate include signal line drivers. Each signal line driver comprises a shift register, a control circuit, a buffer circuit, an analogue switch ASW, and a video bus. This ASW comprises a CMOS transistor that is formed by a combination of n-channel TFT and p-channel TFT because it samples image signals of different polarity on a signal line per horizontal scanning period or per frame period in order to reverse its polarity.

By the way, a small amount of a current flows from a drain to a source of such a TFT even if it is in OFF state (namely, a non-conductive state). Hereinafter, the small amount of the current is referred to as an off-leak current. Under a normal frame frequency, the off-leak current does not affect any display image because the writing for a following image signal is performed before the voltage of the image signal that has already been written into the picture elements is reduced by the off-leak current.

However, when the amount of the off-leak current is increased by the variations of the characteristics of transistors such as TFT, the voltage of the image signal written into the picture elements is greatly fallen during one frame period. This cannot maintain the voltage level that is necessary to display the image signal on the LCD device (hereinafter, this state will be referred to as "off-leak defects").

As a result, when a black (or another color corresponding to this black) is displayed on the LCD device, a color of picture elements in a column to which the image signal of the black has been written through the ASW in the off-leak defect becomes light, for example. The user recognizes this state as a line defect.

Such the defect above can be detected by performing a lighting test after the LCD panel is manufactured. However, in this state, since many LCD panels are conveyed on a manufacturing line, many LCD panels in defect can be manufactured and this causes to reduce the manufacture yields. Furthermore, because of the waste of the processing time and the parts to manufacture the LCD panels, the manufacturing costs for the LCD panels become increased.

Thus, it is preferable to detect the line defect on a LCD panel caused by the off-leak defect during the array substrate fabrication process as early as possible because it is difficult to improve the line defect caused by the off-leak defect after the completion of the manufacturing of the LCD panel.

In order to detect the defect on the array substrate fabrication process, an array tester is currently used. This array tester can perform the inspection that is equivalent to perform the inspection of displaying actual image on the LCD panel after manufactured.

In addition to the off-leak defect of ASW, the array tester can inspect a line defect, a point defect of the picture element, the amount of a current flowing through a scan line/signal line driver circuit, and the operation of a shift register as driver detection.

The ASW off-leak judgment method of comparing a signal wave with an expected value of a signal wave is well known. This signal wave is obtained by writing a test signal into a supplemental capacity connected to each picture element, and by reading this test signal after the writing for one frame has been completed.

However, because the amount of a leak current caused by the off-leak of ASW is little, a small difference of the waveform of the test signal is buried in a measurement error and a noise. Hence, it is difficult to detect the difference of both the waveforms of the test signal and the expected value. Further, even if the judgment for the defect is performed correctly, it is difficult to distinguish the cause of the defect, for example, it is caused by the off-leak defect, or by a short in a wiring, or by other kind of defect.

Thus, the conventional inspection method using the array tester cannot distinguish the kinds of defects, that is, whether or not the detected defect is caused by the off-leak defect of ASW or by the line defect during the array substrate fabrication stage, and it is also difficult to take an optimum countermeasure before the LCD panels including the line defect are conveyed on the manufacturing line and it cannot be avoided to increase the manufacturing costs.

SUMMARY OF THE INVENTION

Accordingly, an object of the present invention is, with due consideration to the drawbacks of the conventional technique, to provide an array substrate inspection method of easily detecting the off-leak defect of ASW during the array substrate fabrication process.

According to an aspect of the present invention, the array substrate inspection method can be applied to an array substrate. For example, the array substrate comprises: a plurality of signal lines; a plurality of scan lines intersecting with the plurality of signal lines; a picture element electrode formed on each intersection of the signal lines and the scan lines; a supplemental capacitor electrically connected to each picture element electrode; a switching element through which the signal line is electrically connected to the corresponding picture element electrode in order to write an image signal supplied through the corresponding signal line to the picture element electrode and the supplemental capacitor based on a gate signal supplied through the corresponding scan line; a video bus through which the image signal is transferred; a signal line driving circuit having analogue switches (ASWs) and a control circuit to control the ON/OFF operation of the ASWs, each ASW supplying the image signal on the video bus to the signal line by electrically conducting the video bus to the corresponding signal line; and a scan line driving circuit supplying the gate signal. In the array substrate inspection method of an embodiment of the present invention, an inspection step is repeated a desired number of times. In each inspection step, a test signal (namely, an image signal to be used in test) supplied to the video bus is written to the supplemental capacitor by entering the analogue switch into a conductive state based on the selection signal, the test signal written in the supplemental capacitor is stored during a desired time period by entering the analogue switch into a non-conductive state by a non-selection of a desired voltage which is different from each other in each inspection step, and the test signal is read from the supplemental capacitor through the corresponding signal line. In each inspection step, the value of the voltage of each non-selection signal to be supplied to the analogue switch is changed.

Thus, in the array substrate inspection method, when the voltage of the non-selection signal (namely, the off-voltage Vgs by which the analogue switch (ASW) enters OFF) is shifted to another voltage, the amount of the leak-current flowing between the drain and the source thereof during the off-state of the analogue switch ASW is also shifted. For example, when a characteristic defect occurs in a p-channel TFT and the off-voltage Vgs forming the ASW is zero, the amount of the leak current is almost equal, namely not changed in both the normal state and the off-leak defect state in the ASW. On the contrary, when the off-voltage Vgs=−1 Volt, the amount of the leak current in the ASW is greatly changed in both the states. That is, when the off-leak occurs in the ASW, the amount of the leak current becomes large when the off-voltage Vgs=−1 Volt. It is thereby possible to easily detect the defect of the array substrate even if the waveform of the test signal includes noise. Further, it is also possible to easily distinguish the off-leak defect from a defect of another type based on the difference of the magnitudes of the two test signals. By the way, the setting of the voltage of the off-voltage for easy evaluation of the waveform of the test signal is changed according to the kind, the degree, and the location of the defect.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

A description will be given of the case in which the array substrate inspection method of the present invention is applied to a liquid crystal display device (LCD device) of active matrix type (AM type).

Figure 1:
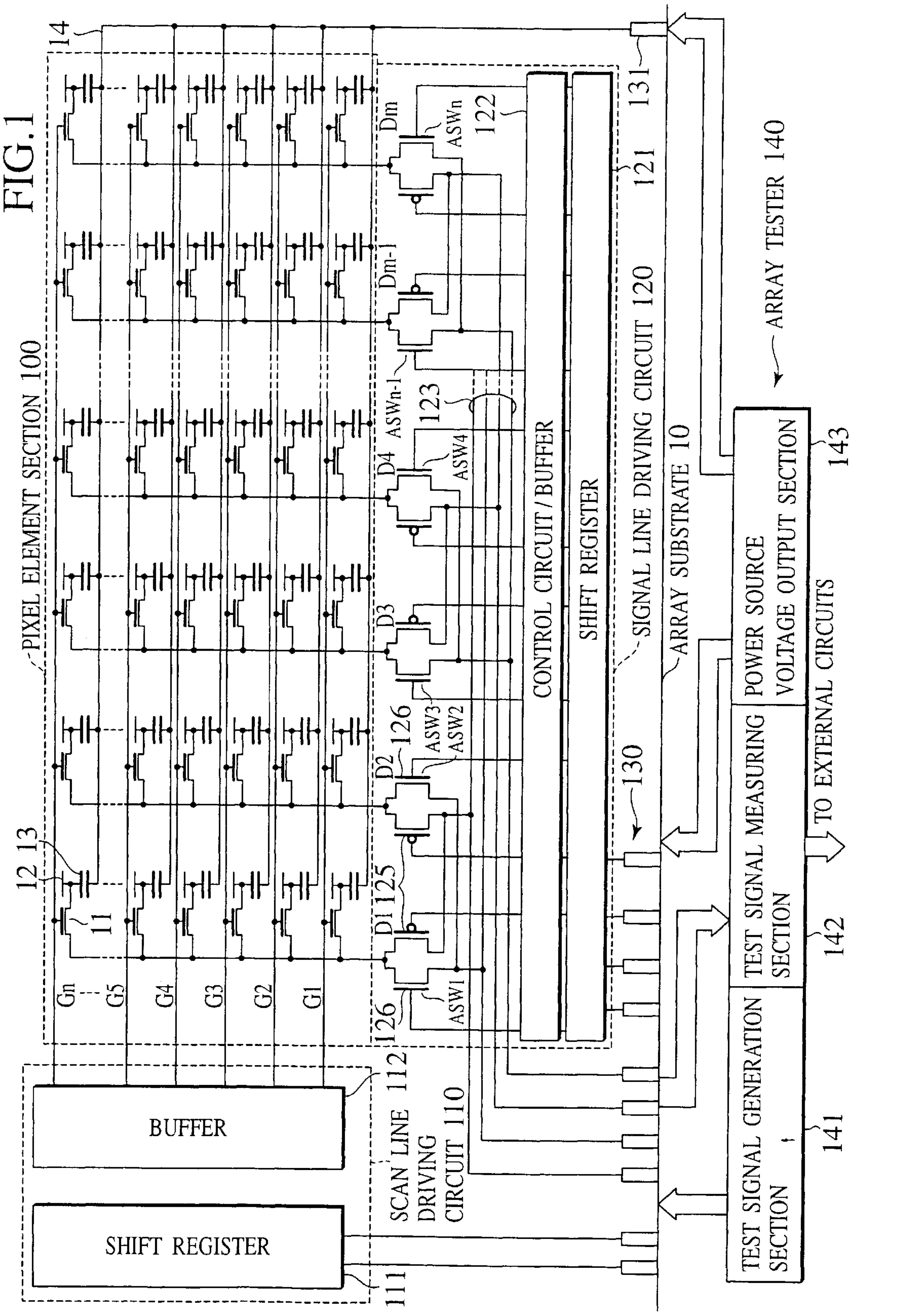
FIG.1 is a circuit diagram showing a configuration of a circuit formed on an array substrate to which the inspection method for an array substrate according to the embodiment of the present invention is applied.

FIG.1 is a circuit diagram showing a configuration of a circuit formed on an array substrate to which the array substrate inspection method according to an embodiment of the present invention is applied.

On an array substrate 10, as shown in FIG. 1, a picture element section 100, a scan line driver circuit 110, a signal line driver section 120, input/output terminals 130 and 131, and the like are formed.

On the picture element section 100, scan lines G1, G2, . . . , Gn and signal lines D1, D2, . . . , Dm are formed, both the lines G1, G2, . . . , Gn and D1, D2, . . . , and Dm intersect with each other. At the point of each intersection, a switch element 11 made up of p channel Silicon(Si) TFT is placed The gate electrode of each switch element 11 is connected to the corresponding scan line G1, G2, . . . , and Gn per horizontal line (or row line), and the source electrode of each switch element 11 is-connected to the signal line D1, D2, . . . , and Dm per vertical line (or column line).

The drain electrode of each switch element 11 is connected to the electrode 12 of the picture element and also connected to a supplemental capacitor 13 formed so that it is electrically connected to the electrode 12 of the picture element.

This supplemental capacitor 13 is connected to a supplemental capacitor line 14 through which a supplemental capacitor voltage is supplied from an external driving circuit (not shown).

In the inspection method (the process of which will be described later) using an array tester 140, this supplemental capacitor 13 receives a constant voltage supplied from a power source voltage output section 143 through the input/output terminal 131.

FIG. 1 does not show opposition electrodes that are placed in opposition section to the electrodes 12 of the picture elements and a liquid crystal layer to be filled between those electrodes, because only the configuration of the array substrate before the fabrication of an LCD panel is shown.

The scan line driving circuit 110 comprises a shift register 111 and a buffer 112. The shift register 111 outputs a gate signal per horizontal scanning period to the scan lines G1, G2, . . . , and Gn based on a vertical start signal and a clock signal (hereinafter, those signals and vertical/horizontal signals will be referred to as “logic signals”) that are supplied through the input/output terminals 130.

In the inspection (whose process will be described later) using the array tester 140, a test signal generation section 141 generates and outputs the logic signals to the shift register 111, and the power source voltage output section 143 supplies a power source voltage to the scan line driving circuit 110 in order to drive it.

The signal line driving circuit 120 comprises a shift register 121, a control circuit/buffer 122, a video bus 123, and analogue switches ASW1, ASW2, . . . , and ASWn.

The shift register 121 controls the operation timing of the control circuit/buffer 122 based on logic signals supplied from the external driving circuit (not shown) through the input/output terminal 130.

In order to output the selection/non-selection signal to each analogue switch ASW, the operation of the control circuit/buffer 122 is controlled by the shift register 212.

The voltage of the selection/non-selection signal is set to a desired level according to the power source voltage supplied from the power source voltage output section 143.

The ON/OFF operation of each of the switches ASW1, ASW2, . . . , and ASWn by the selection/non-selection signal samples the image signal supplied through the video bus 123.

Here, the polarity inverting driving operation is performed for the image signal sampled through the signal lines D1, D2, . . . , Dm. Adjacent rows or adjacent columns in the image signal sampled are inverted to each other in polarity per frame, or adjacent picture elements are inverted to each other in polarity per picture element. In order to perform this function, each of the analogue switches ASW1, ASW2, . . . , ASWm comprises a C-MOS transistor made up of a p-channel TFT 125 and a n-channel TFT 126.

The video bus 123 is wired so that the image signal of a positive polarity and the image signal of a negative polarity are transferred through different lines. For example, the image 25 signal of the positive polarity in odd frame is thereby sampled through the p channel TFT 125 connected to the signal line D1. The image signal of the negative polarity is sampled simultaneously through the n channel TFT 126 connected to the signal line D2.

Next, the image signal of the negative polarity in even frame is sampled through the n channel TFT 126 connected to the signal line D1. The image signal of the positive polarity is sampled simultaneously through the n channel TFT 125 connected to the signal line D2. This switching operation can be achieved by controlling the analogue switches ASW1, ASW2, . . . , and ASWn based on the selection signal from the control circuit/buffer 122.

In the above cases, the p channel TFT 125 enters ON by receiving the selection signal of L level, and also enters OFF by the selection signal of H level.

In the inspection using the array tester 140 (this inspection operation will be described later in detail), the test signal generation section 141 generates and outputs the logical signals to the shift register 111, and also generates and outputs the image signal for test to the video bus 123. In addition, the power source voltage output section 143 outputs the power source voltage to the supplied signal line driving circuit 120.

The array tester 140 is provided as an external circuit that is separated in configuration from the array substrate 10. The array tester 140 comprises a test signal measurement section 142 and the power source voltage output section 143.

The test signal generation section 141 supplies the image signal for test (hereinafter referred to as "a test signal" for brevity) onto the video bus 123, and also supplies the logical signals to both the scan line driving circuit 110 and the signal line driving circuit 120 through the input/output terminals 130.

The test signal measurement section 142 reads the test signal that has been written into the supplemental capacity 13 in the picture element section 100 and measures the waveform of this test signal.

The writing operation is performed twice, that will be explained later. The test signal measurement section 142 outputs the waveform of the signal measured. Further, the test signal measurement section 142 measures the consumption current in both the scan line driving section 110 and the signal line driving section 120, and also measures the magnitude of the waveform of the signal for the shift operation by the shift register 111, and then outputs the results of the measurement to the external device (not shown).

The power source voltage output section 143 supplies the power source voltage for driving the scan line driving circuit 110 and the signal line driving circuit 120 and also supplies a supplemental voltage to the supplemental capacitor line 14. Moreover, the power source voltage output section 143 also outputs the power source voltage to the test signal generation section 141 and the test signal measurement section 142. These voltages are supplied from the power source voltage output section 143 to the above circuits 110 and 120 and the test signal generation section 141 and the test signal measurement section 142 through the input/output terminals 130 and 131.

Next, a description will be given of the operation of inspection method for off-leak defect in the analogue switches ASW1, ASW2, . . . , and ASWn formed on the array substrate 10 having the configuration described above.

First, the power source voltage output section 143 supplies the power source voltage to the scan line driving circuit 110, the signal line driving circuit 120 and other sections.

In the first writing of the test signal, the power source voltage output section 143 supplies, to the signal line driving circuit 120, the voltage of 10 Volts (hereinafter, referred to as the standard voltage) that is equal in level to the voltage used in the normal inspection process.

In addition, the test signal generation section 141 outputs the test signal onto the video bus 123 and also provides the logical signals to the scan line driving circuit 110 and the signal line driving circuit 120.

By supplying both the power source voltage and the logical signals, each driving circuit operates as follows:

The following example is a simple case where the test signal will be written into the supplemental capacitor 13 on the horizontal line connected to the scan line G1. By the way, because the actual inspection process performs other inspections such as point defect and the like simultaneously, the test signal is written into all the picture elements in addition to the above detection process.

When the scan line driving circuit 110 outputs the gate signal to the scan line G1, only the switch element 11 on one horizontal line enters ON during the horizontal scan period. During this period, the control circuit/buffer 122 outputs the selection signal and the analogue switches ASW1, ASW2, . . . , and ASWn enter thereby ON in order. As a result, the test signal on the video bus 123 is sampled to the signal lines D1, D2, . . . , and Dm through the analogue switches ASW1, ASW2, . . . , and ASWn in order.

The test signal sampled on the signal lines D1, D2, . . . , and Dm is written into the supplemental capacitor 13 through the switch element 11 under ON state. The selection signal output from the control circuit/buffer 122 is switched to the non-selection signal after the lapse of a predetermined time period. When the analogue switches ASW1, ASW2, . . . , and ASWn enter OFF, the lines between the signal lines D1, D2, . . . , and Dm and the video bus 123 enter the non-conductive state in which no signal can be transferred.

Next, when the scan line driving circuit 110 outputs the gate signal to the scan line G1 after the lapse of one frame period (or one horizontal scan period), the switch elements 11 on the horizontal line enter ON again. During this operation, the control circuit/buffer 122 outputs the selection signal, and the analogue switches ASW1, ASW2, . . . , and ASWn thereby enter ON in order.

As a result, the test signal that has been charged in the supplemental capacitor 13 on one horizontal line is read through the signal lines D1, D2, . . . , and Dm and the analogue switches ASW1, ASW2, . . . , and ASWn, and is finally output to the test signal measurement section 142.

The test signal measurement section 142 measures the magnitude of the waveform of the test signal that has been read and outputs the waveform of the test signal to the external circuit (not shown).

Following the above operation, the second writing and reading will be performed. During the second writing and reading operation, the power source voltage output section 143 in the array tester 140 outputs a lower voltage, which is lower than that of the standard voltage, to the signal line driving circuit 120. For example, when the standard voltage is 10 volts, the power source voltage output section 143 outputs the voltage of 9 volts to the signal line driving circuit 120. As a result, the signal line driving circuit 120 outputs the non-selection signal whose voltage amplitude becomes small. In an example of the p channel TFT, in a case that the gate-source voltage of the non-selection signal is zero (0) volt) when the standard power source voltage is 10 Volts, the voltage of the non-selection signal becomes −1 volt when the power source voltage is 9 volts.

A description will be given of the relationship between the power source voltage of the signal line driving circuit 120 and the transistor characteristic of the analogue switch ASW.

Figure 2:
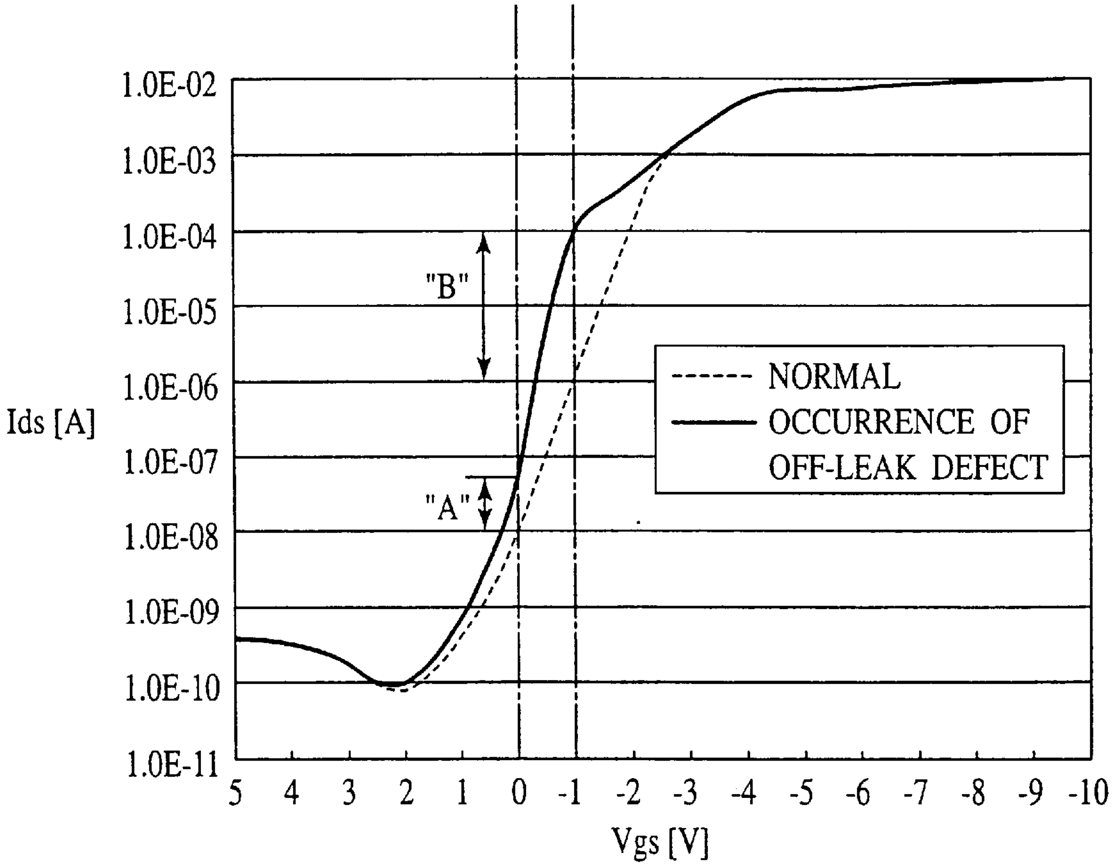
FIG.2 is a diagram to explain the relationship between a voltage Vgs and a current Ids in a p channel TFT formed on the array substrate shown in FIG.1.

FIG. 2 is a diagram to explain a relationship between a voltage Vgs (as the off-voltage or the gate-source voltage) and a current Ids (as the drain-source current) in the p channel TFT formed on the array substrate shown in FIG. 1. In FIG. 2, the dotted line designates the characteristic of the normal state and the solid line indicates the characteristic in the off-leak state.

When the off-voltage is zero (0) volt, the current flowing through the drain and the source of the analogue switch ASW, namely, the amount of the leak current while the analogue switch ASW is in the OFF state, is almost equal in both the cases of the normal state and the occurrence of the off-leak defect, as shown by the reference character "A" in FIG. 2. There is no difference. However, when the off-voltage Vgs is "−1 Volt", the amount of the leak current is greatly changed between the normal state and the occurrence of the off-leak defect, as shown by the reference character "B" in FIG. 2. Namely, there is a large difference between the normal state and the occurrence of the off-leak state defect.

That is, when the off-leak occurs in the analogue switch ASW, it is possible to detect a defect easily even if the waveform of the signal includes noise, because the amount of the leak current under the off-voltage Vg of −1 volt becomes large. Further, based on the difference of the magnitudes of the test signals which are read twice from the same supplemental capacitor, it is possible to easily distinguish the off-leak defect from defects of other types. The optimum value of the voltage for easy evaluation of the waveform of the signal is changed based on the kinds of defects and the position of the defect.

In the array substrate inspection method according to the preferred embodiment of the present invention, both the standard power source voltage (10 volts) and the lower power source voltage (9 volts) are supplied to the signal line-driving circuit 120, and the image signals obtained by these two voltages are read. When the difference of the waveforms of both the image signals is within a permissible range of error, it is recognized that no defect or a defect of another type occurs. On the contrary, when the difference is out of the permissible range of the error, it is recognized that the off-leak defect occurs.

The judgment operation described above can be performed by a judgment system (not shown) that is placed at the external circuit (also not shown). For example, this type of the judgment system is a system that converts a waveform of the signal to a digital signal and then compares and judges it.

According to the inspection method of an array substrate of the preferred embodiment, when the off-leak defect occurs in the analogue switch ASW, it is possible to detect the defect easily by adjusting the non-selection voltage to an optimum level even if the waveform of the signal includes any noise.

Further, it is possible to distinguish the off-leak defect from other types of defects based on the difference of the magnitudes of the two test signals that have been read from the same supplemental capacitor.

By the way, the setting of the voltage for easy evaluation of the waveform of the signal is changed according to the kinds of the defects, the degree of the defect, and the place of the defect. Therefore it is possible to take a countermeasure to avoid the occurrence of the off-leak defect before panels are conveyed on a manufacturing line. This can achieve to enhance the manufacturing yield. Furthermore, it is possible to eliminate the waste of various process and parts during the manufacturing of LCD panels and thereby possible to reduce the manufacturing cost.

By the way, in the above preferred embodiment, it is impossible to distinguish the off-leak defect of the analogue switch ASW from the defects of other types only when the test signal is read under the non-selection voltage of −1 volt. That is, as has been disclosed in this preferred embodiment, it is necessary to perform the following processes in order to judge the off-leak defect of the analogue switch ASW precisely:

Two voltages, the standard power source voltage and the lower power source voltage, are supplied to the signal line driving circuit 120;

The voltage of the non-selection signal is thereby switched;

Two test signals are written based on these two voltages; and

The two test signals are read and compared.

However, when the power source voltage is set to a lower level, the signal line driving circuit itself cannot operate. Although it is changed by conditions, it is preferable to set a voltage whose magnitude is approximately 10 percent below of the standard power source voltage that is ordinary used. In addition, in the embodiment shown in FIG. 1, because the use of the values of the power source voltage to be supplied to the signal line driving circuit 120 and the off voltage Vgs of the ASW is an example case, this is not to say that it is possible to apply the present invention to signal line driving circuits and ASW having a different configuration in design that operate under different voltages.

Although there are various types of, in wiring configuration and circuit configuration, the video bus 123 and ASW 124 in the signal line driving circuit 120 according to driving methods, the present invention can be applied to ordinal signal line driving circuits using ASW.

As set forth in detail, in the array substrate inspection method of the present invention, ASW is set into a non-conductive state under two off-voltages of different values, a test signal is written into the ASW under the two different off-voltages, the test signal is then read from the ASW, and the waveforms of the test signals are compared in order to judge whether or not the off-leak defect occurs. Thus it is possible to easily detect the presence of the off-leak defect, because the off-voltages are set so that the amount of the off-leak current becomes large. Further, when the ASW enters into the non-conducive state under the two off-leak voltages of different voltage values, the difference between the magnitudes of the test signals that are read from the same supplemental capacitor becomes large noticeably. Accordingly, even if signal waveforms of the test signals include any noise, it is possible to easily compare the signal waveforms, and also to distinguish the off-leak defect from other types of defects easily. It is thereby possible to easily detect the off-leak defect of ASW in the array substrate fabrication process.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. An array substrate inspection method of inspecting an array substrate which comprises: a plurality of signal lines; a plurality of scan lines intersecting with the plurality of signal lines; a picture element electrode formed on each intersection of the signal lines and the scan lines; a supplemental capacitor electrically connected to each picture element electrode; a switching element through which the signal line is electrically connected to the corresponding picture element electrode in order to write an image signal supplied through the corresponding signal line to the picture element electrode and the supplemental capacitor based on a gate signal supplied through the corresponding scan line; a video bus through which the image signal is transferred; a signal line driving circuit having analogue switches and a control circuit for controlling ON/OFF operation of the analogue switches, each analogue switch supplying the image signal on the video bus to the signal line by electrically conducting the video bus to the corresponding signal line; and a scan line driving circuit supplying the gate signal to the scan lines, wherein the array substrate inspection method repeats an inspection step desired times, and each inspection step comprises:

writing a test signal supplied on the video bus to the supplemental capacitor by entering the analogue switch into a conductive stated based on a selection signal;

storing the test signal written in the supplemental capacitor during a desired time period by entering the analogue switch into a non-conductive state by a non-selection signal of a desired voltage which is different in each inspection step; and reading the test signal from the supplemental capacitor through the corresponding signal line.

2. The array substrate inspection method according to claim 1, wherein the defect of the analogue switch is detected based on the comparison result of the test signal read from the supplemental capacitor in each inspection step which is repeated.

3. The array substrate inspection method according to claim 2, wherein the voltage of the non-selection signal is set according to a power source voltage supplied to the signal line driving circuit.

4. The array substrate inspection method according to claim 3, wherein each inspection step is applied to an array substrate including the signal line driving circuit in which each analogue switch comprises a c-MOS transistor obtained by a combination of a n-channel TFT and a p-channel TFT.

5. The array substrate inspection method according to claim 2, wherein each inspection step is applied to an array substrate including the signal line driving circuit in which each analogue switch comprises a c-MOS transistor obtained by a combination of a n-channel TFT and a p-channel TFT.

6. The array substrate inspection method according to claim 1, wherein the voltage of the non-selection signal is set according to a power source voltage supplied to the signal line driving circuit.

7. The array substrate inspection method according to claim 6, wherein each inspection step is applied to an array substrate including the signal line driving circuit in which each analogue switch comprises a c-MOS transistor obtained by a combination of a n-channel TFT and a p-channel TFT.

8. The array substrate inspection method according to claim 1, wherein each inspection step is applied to an array substrate including the signal line driving circuit in which each analogue switch comprises a c-MOS transistor obtained by a combination of a n-channel TFT and a p-channel TFT.

9. An array substrate inspection method of inspecting an array substrate which comprises: a plurality of signal lines; a plurality of scan lines intersecting with the plurality of signal lines; a picture element electrode formed on intersections of the signal lines and the scan lines; a supplemental capacitor electrically connected to each picture element electrode; a switching element connected to respective ones of the signal lines; a video bus; a signal line driving circuit having analogue switches and a control circuit for controlling ON/OFF operation of the analogue switches, each analogue switch electrically conducting the video bus to the corresponding signal line; and a scan line driving circuit supplying the gate signal to the scan lines, said method comprising:

writing a first test signal supplied on the video bus to the supplemental capacitor by placing the analogue switch into a conductive state based on a selection signal;

storing a first signal written in the supplemental capacitor during a first desired time period by placing the analogue switch into a non-conductive state by a non-selection signal of a first voltage;

writing a second test signal supplied on the video bus to the supplemental capacitor by placing the analogue switch into a conductive state based on said selection signal;

storing a second signal written in the supplemental capacitor during a second desired time period by placing the analogue switch into a non-conductive state by a non-selection signal of a second voltage of different value than that of said first voltage; and reading the first and second signals from the supplemental capacitor through the corresponding signal line.

10. The array substrate inspection method according to claim 9, comprising:

comparing said first and second signals.

* * * * *